(12) United States Patent
Ortiz et al.

(10) Patent No.: US 8,907,726 B2
(45) Date of Patent: Dec. 9, 2014

(54) VOLTAGE, CURRENT, AND SATURATION PREVENTION

(71) Applicant: RF Micro Devices, Inc., Greensboro, NC (US)

(72) Inventors: Jeffery P. Ortiz, Chandler, AZ (US); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 59 days.

(21) Appl. No.: 13/668,641

(22) Filed: Nov. 5, 2012

(65) Prior Publication Data

US 2013/0113556 A1 May 9, 2013

Related U.S. Application Data

(60) Provisional application No. 61/555,903, filed on Nov. 4, 2011.

(51) Int. Cl.
*H03F 3/45* (2006.01)
*H03G 3/30* (2006.01)

(52) U.S. Cl.
CPC ................... *H03G 3/3042* (2013.01)
USPC .......................... 330/285; 330/296

(58) Field of Classification Search
USPC ................. 330/285, 296, 261, 260
See application file for complete search history.

(56) References Cited

U.S. PATENT DOCUMENTS

| | | | |
|---|---|---|---|
| 6,233,511 B1 * | 5/2001 | Berger et al. | 701/50 |
| 7,664,572 B2 * | 2/2010 | Takenaka et al. | 700/253 |
| 7,889,525 B2 * | 2/2011 | Moussaoui | 363/65 |
| 8,003,930 B2 * | 8/2011 | Otsuka et al. | 250/214 AL |
| 8,571,762 B2 * | 10/2013 | McAree et al. | 701/50 |

* cited by examiner

*Primary Examiner* — Henry Choe
(74) *Attorney, Agent, or Firm* — Withrow & Terranova, P.L.L.C.

(57) ABSTRACT

In one embodiment, saturation of the control system of a power amplifier is limited by comparing a control voltage at a first control node against a scaled battery voltage, and then drawing an error current away from the first control node when the control voltage exceeds the scaled battery voltage. The first control node may be located after a trans-conductance amplifier in a feedback control system.

28 Claims, 12 Drawing Sheets

VOLTAGE, CURRENT, AND SATURATION PREVENTION

RELATED APPLICATIONS

This application claims the benefit of provisional patent application Ser. No. 61/555,903, filed Nov. 4, 2011, the disclosure of which is hereby incorporated herein by reference in its entirety.

FIELD OF THE DISCLOSURE

The field of the disclosure is improving a performance of a power amplifier by preventing saturation of the power amplifier.

BACKGROUND

In any power amplifier (PA) system, a saturation condition can occur where the target power (desired power) is beyond the capability of the PA under the conditions at a given instant of time. If the target power level is not reduced under these conditions, then the control system of the PA will enter a state where the PA system will not respond to accurate power control on a timely basis. This will result in violation of spectral purity and may result in damage to the PA.

FIG. 1 illustrates a conventional power amplifier (PA) system powering up, reaching saturation, and "winding up."

In FIG. 1, Vramp is a control signal set at the desired output voltage of the power amplifier. Vapc is an integration control system voltage, which will be discussed in more detail later. SATURATION INDICATOR is a saturation flag that reads 1 volt when the PA is saturated, and read 0 volts when the PA is not saturated.

In FIG. 1, Vramp ramps from 0 volts to 1.5 volts. SATURATION INDICATOR indicates that the PA is saturated at 64 qs, and stays saturated afterwards. Control signal Vapc follows Vramp relatively closely until after saturation occurs at 64 qs, and then continues increasing until a maximum value of 2.5 volts (a "wind up" voltage) is reached. (A "qs" is a standard unit of time in telecommunications, and is equivalent to about 3.69 microseconds.) This excessively high Vapc voltage creates many problems.

In other words, the control system of the PA will continue to increase the drive to the PA in an attempt to balance the integrator inputs of the control system, even when these attempts are no longer having any additional effect on the PA. For example, the voltage to the PA has been driven up to the battery voltage, so any additional increases in Vapc have no effect on the power of the PA. This situation is most likely at high temperature and low battery voltage, wherein the maximum PA output power is small. The term "battery voltage" is used in this specification and claims broadly to refer to a power supply voltage, from a battery or from some other source.

FIG. 2 illustrates a saturated PA system winding down. In FIG. 2, Vramp begins at 1.5 volts, and smoothly drops to about 0.3 volts. The SATURATION INDICATOR flag indicates that the PA stops being saturated at 656 qs. However, the integration control system voltage Vapc unfortunately begins at a "wind up" voltage of 2.5 volts, and then violently starts dropping at 659 qs as the control system tries to follow Vramp.

In other words, during this "ramp down" period, the integrator has to "un-wind" (discharge its capacitors) before the actual ramp down can begin. Then the integrator has to try to catch up with the decreasing Vramp, and the result is a poorly shaped Vapc curve that causes switching spectrum problems. Note the delay on the Vapc curve, where from 657 qs to 659 qs the Vapc stays at 2.5 volts even though Vramp has already started ramping downward. This delay is typically caused by the need to discharge capacitors that have been wound up due to saturation problems.

FIG. 3 illustrates the effect of saturation on the PA output power during a ramp down, starting at a saturated power level of approximately 32 dbm. In FIG. 3, the ideal power curve smoothly drops, starting at 657 qs. In contrast, the measured power curve does not begin dropping until 661 qs, indicating a delay of about 4 qs as the capacitor in the control circuit discharges. Additionally, the measured power turns downward very sharply (violently) from 661 to 663 qs, in comparison with the smooth ideal power curve. This sharp turn causes many problems.

FIG. 4 illustrates a switching spectrum with an ETSI (European Telecommunications Standards Institute) violation. In FIG. 4, the ramp curve ramps up at about 70 qs, then ramps down at about 670 qs. The ETSI Limit (horizontal line) indicates that the spectral content should not exceed a maximum of −22 dBm.

The −400 kHz Ideal and the +400 kHz Ideal curves indicate ideal curves offset by +/−400 kHz from a carrier frequency of 900 MHz. The real −400 kHz and the real +400 kHz curves indicate the actual (non-ideal) spectrum.

At point A, the real −400 kHz and the real +400 kHz curves both have high peaks at 690 qs that exceed the ETSI Limit. These undesired high peaks illustrate the problems caused by ramping down from a "wound up" integration control system.

The above discussion of FIGS. 1-4 was presented for a closed loop system with an integration control system. Similar problems occur for an open loop system that controls output power with a collector supply voltage. In this open loop system, there is no integrator to "wind-up" to the supply voltage, but instead there is a large PFET (with substantial internal capacitance) that will drive to zero a drain to source voltage, and will still wind-up (although to a lesser extent than a closed loop system).

SUMMARY

In one embodiment of a power amplifier control system for limiting saturation (a saturation limiter), a scaled battery voltage is compared against a first control voltage, and then an error current is drawn away from a node in the control system based on the results of the comparison.

In one embodiment of a power amplifier control system for limiting a maximum voltage to the power amplifier (a voltage limiter), a first control voltage is compared against a fixed predetermined voltage, and then an error current is drawn away from a node in the control system based on the results of the comparison.

In one embodiment of a power amplifier control system for limiting a current to the power amplifier (a current limiter), a voltage based on the current to the power amplifier is compared against a fixed predetermined voltage, and then an error current is drawn away from a node in the control system based on the results of the comparison.

Some embodiments relate to a method of avoiding saturation as well as over voltage or over current conditions for a power amplifier (PA) controlled by a particular type of controller. These embodiments allow precise and fast correction of saturation, over-voltage, or over-current conditions in the PA. These embodiments may be in an open or closed loop configuration.

Some embodiments also provide over-voltage and over-current limiting or protection features.

Some embodiments are particularly beneficial in SiGe PA designs, where the voltage and current must be tightly limited due to robustness concerns.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
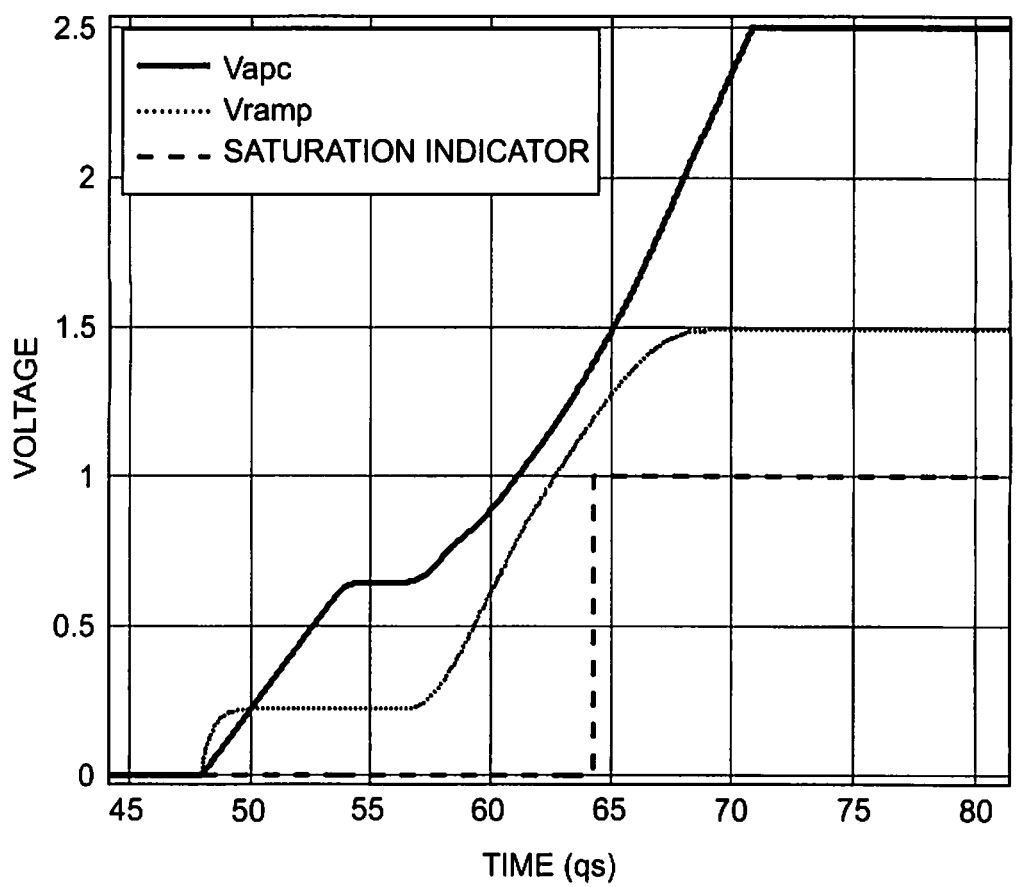
FIG. 1 illustrates a conventional power amplifier (PA) system powering up, reaching saturation, and "winding up."

FIG. 1 illustrates a conventional power amplifier (PA) system powering up, reaching saturation, and "winding up." This figure is described in the Background section.

Figure 2:
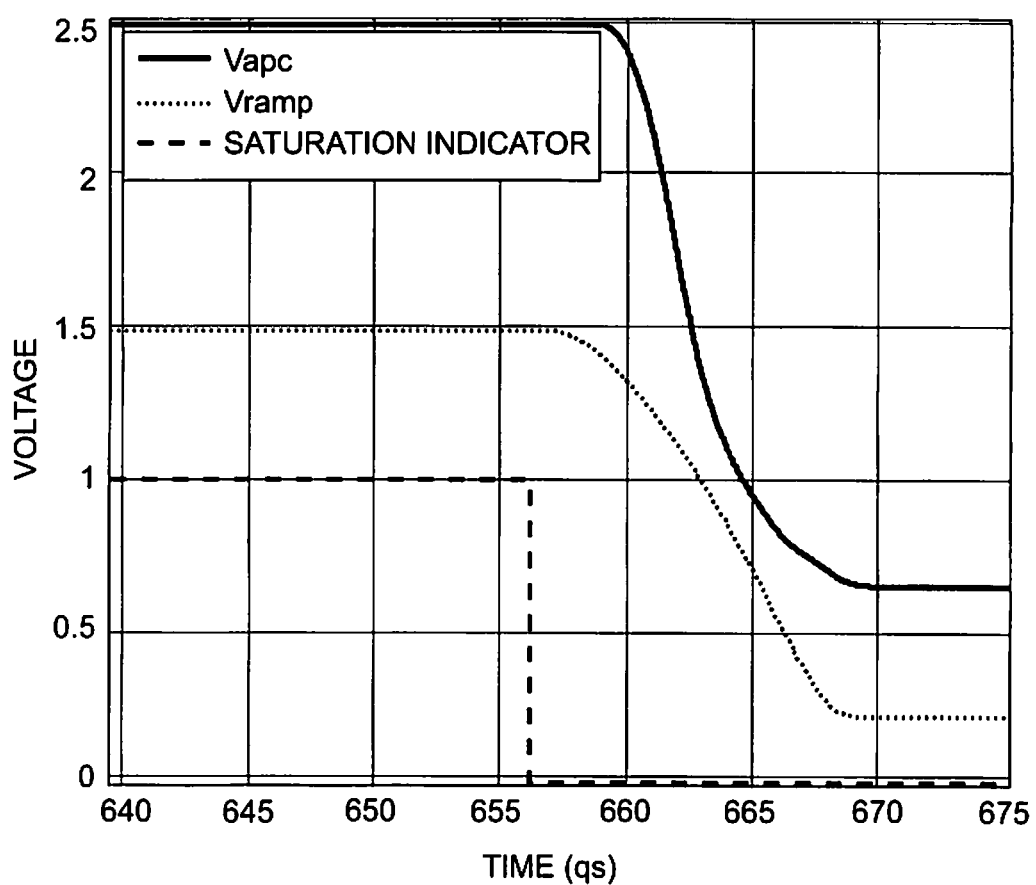
FIG. 2 illustrates a saturated PA system winding down.

FIG. 2 illustrates a saturated PA system winding down. This figure is described in the Background section.

Figure 3:
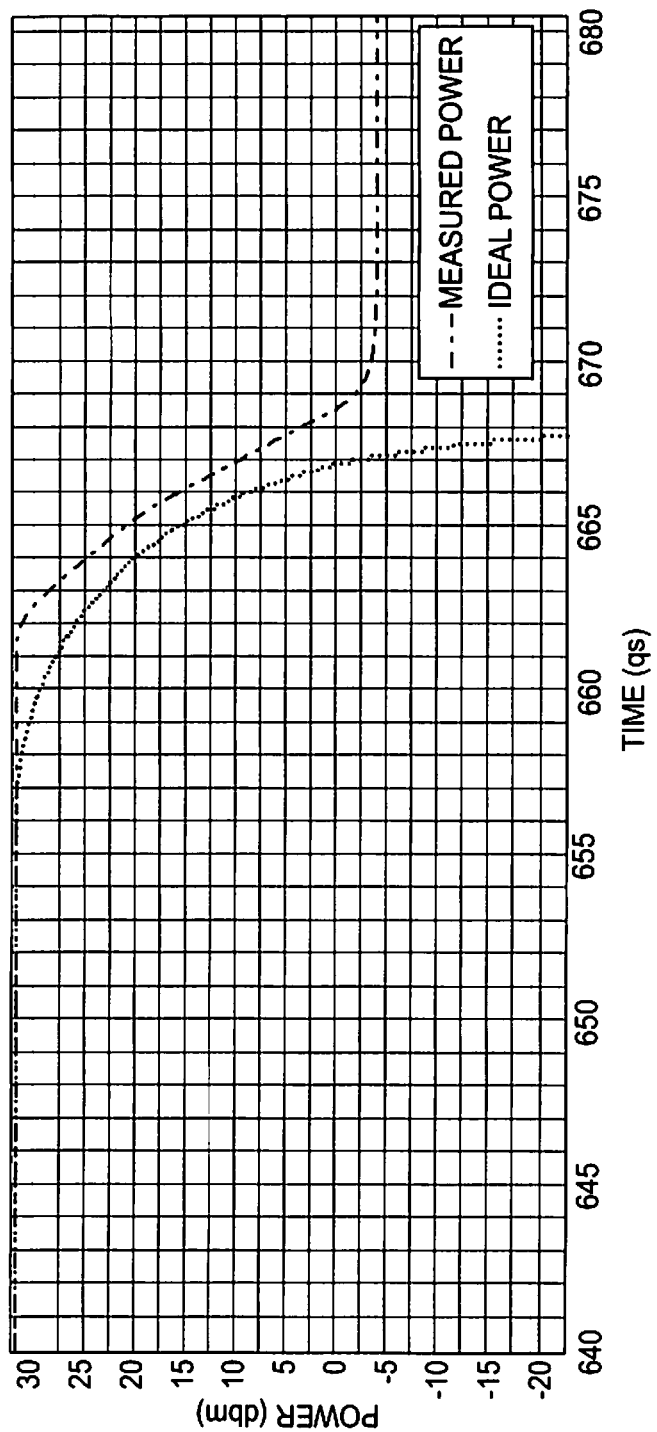
FIG. 3 illustrates the effect of saturation on the PA output power during a ramp down, starting at a saturated power level of approximately 32 dbm.

FIG. 3 illustrates the effect of saturation on the PA output power during a ramp down, starting at a saturated power level of approximately 32 dbm. This figure is described in the Background section.

Figure 4:
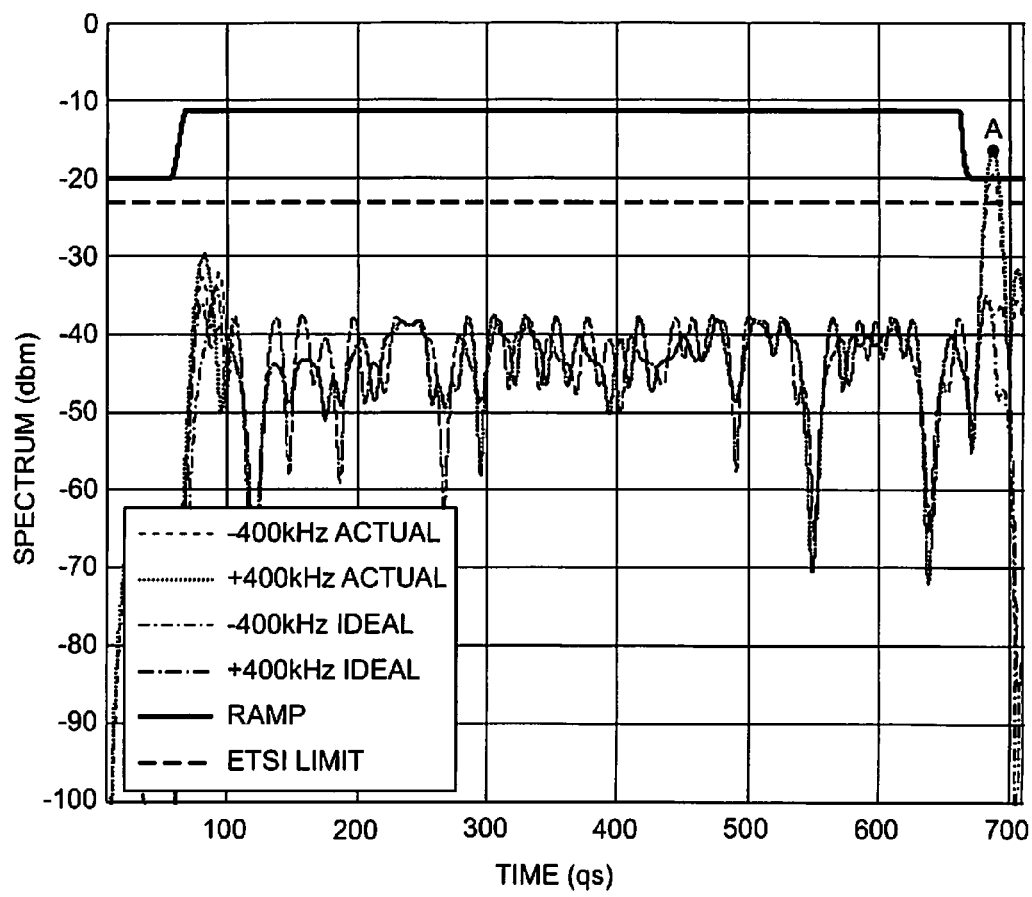
FIG. 4 illustrates a switching spectrum with an ETSI (European Telecommunications Standards Institute) violation.

FIG. 4 illustrates a switching spectrum with an ETSI (European Telecommunications Standards Institute) violation. This figure is described in the Background section.

Figure 5:
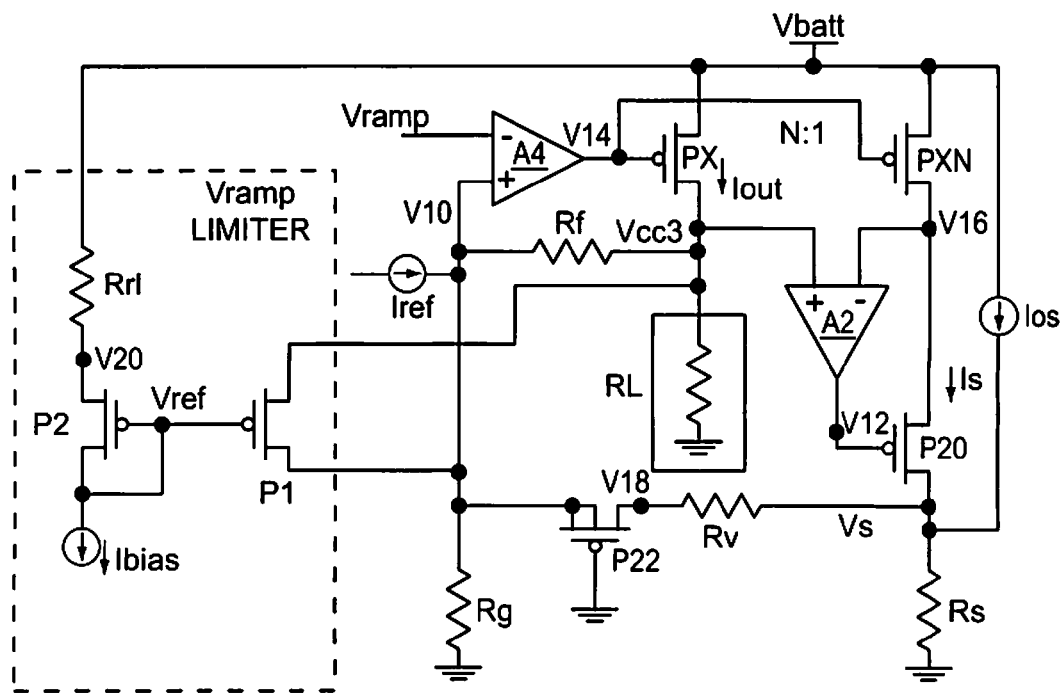
FIG. 5 is a conventional Vramp Limiter system.

FIG. 5 is a conventional Vramp limiter system.

In FIG. 5, the resistor RL represents a power amplifier PA which is being controlled by the remainder of the circuit. The remainder of the circuit controls voltage Vcc3 to the PA primarily as a function of Vramp, but with some influence from the dashed box labeled Vramp LIMITER.

Vbatt is a power supply voltage such as a battery in a cell phone. Current source Iref along with resistors Rf and Rg create a reference voltage V10. Amplifier A4 compares a control voltage Vramp with reference voltage V10, and generates an output voltage V14.

Output voltage V14 controls the gate of main PFET (P-channel MOSFET transistor) PX, and outputs a current Iout that generates voltage Vcc3. Vcc3 controls power amplifier RL.

As voltage Vcc3 rises, and approaches Vbatt, then PFET PX located between VBAT and VCC3 will enter a non-linear range of operation (with respect to voltage V14, and also with respect to Vramp). For example, any additional decrease in V14 will have little or no effect on Vcc3, because Vcc3 cannot exceed Vbatt. Any additional decrease in V14 will "wind up" the substantial internal capacitances of PFET PX and will cause "wind down" problems similar to those discussed in the Background section. When the system "winds down" after such a "wind up," this will cause a switching spectrum failure because VCC3 will not track Vramp until the PFET PX discharges its internal capacitance.

The dashed box labeled "Vramp LIMITER" illustrates one conventional way to address these problems by creating a reference voltage V20 that will be used to reduce the drive level (voltage V14) to the PFET PX gate by increasing voltage V14, thus stopping any further increase in Vcc3.

To summarize, as Vcc3 equals or exceeds V20, then V10 is increased, then V14 is increased, then Vcc3 is stopped from increasing (and possibly even decreased).

A reference voltage Vref is formed by the gate to source voltage of P2 in series with the voltage drop across Rr1. Under normal circumstances, this voltage is smaller than the voltage drop formed by the sum of the gate-to-source voltage of P1 plus the drain to source voltage of PFET PX that sources Vcc3. Thus, P1 normally conducts no current (and does not lower Vcc3).

When Vcc3 rises such that the drain to source voltage of the main PFET PX approaches zero (when Vcc3 approaches Vbatt), then the voltage from the gate to source of P1 will become greater than the voltage from the gate to source of P2, and thus P1 will conduct current. The current conducted by P1 is forced into the feedback node V10 of the amplifier A4 driving the PFET PX. This increases the feedback voltage V14, thus decreasing Vcc3, and thus the PFET PX drain to source voltage does not become excessively small and remains in normal operational mode.

This circuit of FIG. 5 has two major weaknesses. First, all of the collector regulator circuitry is contained within the control loop. As the control loop output voltage Vcc3 approaches the battery voltage Vbatt, the bandwidth will approach zero as the regulator circuitry will not respond for a control voltage that would place the output voltage above the battery voltage.

Thus, the response time of the loop will degrade as the limiting level is set closer to the battery voltage. The system could become unstable if the voltage gets too close to the battery voltage and the bandwidth drops too far.

To summarize, basing control decisions directly based on Vcc3 is problematic.

The second weakness with this circuit is that the response of the Vramp LIMITER circuit to changes in the input ramp level Vramp is not very abrupt, and thus the output voltage V14 will continue to fall at a progressively lower slope as Vramp rises above the "threshold." This makes for an uncertain limiting level and may cause problems due to temperature and part variations.

Figure 6:
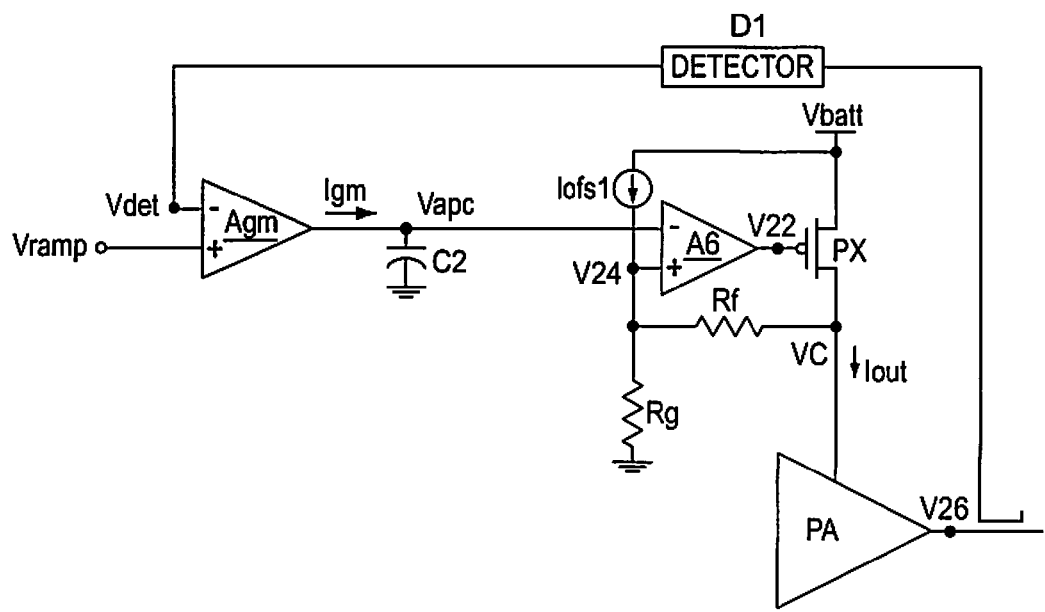
FIG. 6 illustrates a relatively simple feedback integrative control system for a power amplifier.

FIG. 6 illustrates a relatively simple feedback (closed loop) integrative control system for a power amplifier. Three distinct circuit bocks are not shown in FIG. 6, but are shown in later figures. These circuit blocks are listed here for the sake of completeness: SATURATION LIMITER, VCmax LIMITER, and CURRENT LIMITER.

In FIG. 6, the power amplifier PA is controlled by a feedback system. The power amplifier PA outputs a voltage V26 which is detected by detector D1, and fed back as input Vdet to trans-conductance amplifier Agm. Trans-conductance amplifier Agm receives control input Vramp as a second input, and generates a current Igm as a function of the difference between Vramp and Vdet. If Vramp equals Vdet, then no current is generated.

If Vramp is greater than Vdet, then Igm is positive. The positive current Igm causes charge to accumulate (integrates charge) in integrative capacitor C2, thus driving up trans-conductance output voltage Vapc.

Amplifier A6 receives voltage Vapc and voltage V24 as inputs, and generates scaled voltage V22. The mathematical equations of this scaling are discussed later, and depend upon the values of resistors Rg and Rf.

Scaled voltage V22 drives the gate of main PFET PX, which uses voltage Vbatt to generate control voltage VC. Control voltage VC controls the power amplifier PA, which outputs a power amplifier output voltage V26.

To summarize, the integrative feedback control system of FIG. 6 is subject to the problems previously discussed with respect to FIGS. 1-5.

To reduce these problems, three distinct circuit bocks are disclosed below:
 SATURATION LIMITER,
 VCmax LIMITER, and
 CURRENT LIMITER.

Each of these circuit blocks operates on a different principal. In some embodiments, VCmax LIMITER shares some components with SATURATION LIMITER (specifically, as shown in later figures, it shares current source Ibias, PFET P2, NFET N2, and NFET N2B), although this sharing (or merging) is not essential.

Figure 7:
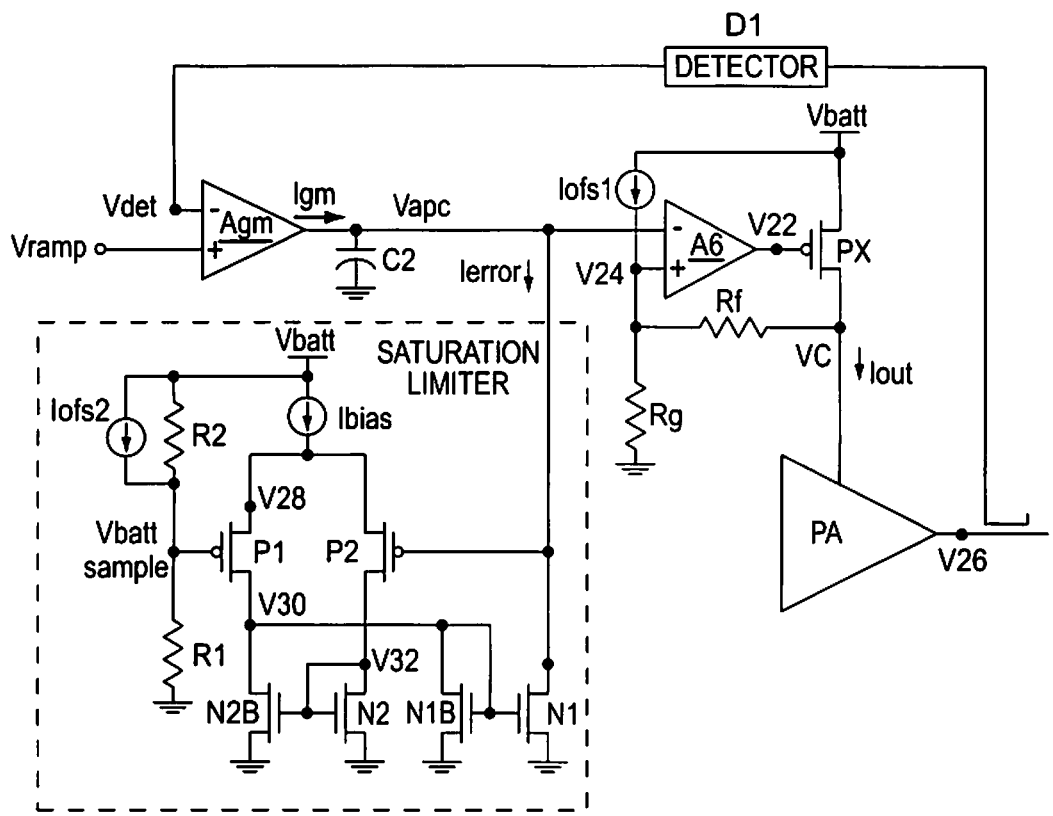
FIG. 7 illustrates a SATURATION LIMITER, as part of a feedback (closed loop) integrative control system for a power amplifier.

FIG. 7 illustrates a SATURATION LIMITER, as part of a feedback (closed loop) integrative control system for a power amplifier. This Saturation Limiter prevents control voltage VC from getting too large relative to a scaled battery voltage.

FIG. 7 is similar to FIG. 6, but with the addition of a Saturation Limiter circuit block (in a dashed rectangle).

As previously discussed with respect to FIG. 6, as VC rises, a problematic situation may be reached where VC approaches Vbatt. Such a situation may occur if the battery voltage is low, and/or if the load presents a poor VSWR (voltage standing wave ratio). In this situation, PFET PX (between Vbatt and VC) will enter a non-linear range of operation, and the PA will not be able to achieve the desired output power level.

If this situation occurs, then the integrator will ramp up to the supply voltage (the battery voltage) in an attempt to force the PA output power to match the level desired by Vramp. When the system ramps down at the end of the burst, then the integrator must "un-wind" the voltage by discharging the capacitor C2 of the integrator. Such a situation will cause a switching spectrum failure because VC will not track Vramp until the integrator re-enters the linear regime.

In order to avoid these problems, the Saturation Limiter circuit (dashed box at the bottom left of FIG. 7) detects when the drain-to-source voltage of PFET PX falls below a critical threshold, or equivalently when the collector voltage VC rises to within a threshold of the battery voltage Vbatt. If this happens, then a current Ierror is pulled from the integrator to stop any further increase in VC at a level that does not result in saturation of the integrator or of the PFET.

Note that this Saturation Limiter control is performed with a PFET based comparator sensing Vapc (in contrast to the conventional "Vramp limiter" circuit of FIG. 5 that operates based on VC). This Saturation Limiter control sharpens the detection point and greatly speeds up the circuit response.

Specifically, the Saturation Limiter generates a scaled battery voltage Vbatt_sample as a fraction of Vbatt. See equations below. As Vbatt decreases (for example, due to the battery running out of stored energy), then Vbatt_sample immediately decreases.

Under good conditions, Vbatt_sample is greater than Vapc, and no current is drawn through NFET N1, thus Ierror is zero. However, as Vapc approaches or exceeds Vbatt_sample, current is drawn through NFET N1, and Ierror is positive and is drawn from the Vapc node. This positive current Ierror will at least slow the charging of capacitor C2, and may even discharge capacitor C2 (if Ierror is greater Igm).

The PA control system has a well-defined gain and offset that are defined by the ratio of $R_f/R_g$ and the offset current $I_{ofs1}$.

$$V_C = \left(\frac{R_f}{R_g} + 1\right)\left[v_{apc} - \frac{1_{of\ s1} Rf}{\left(\frac{R_f}{R_s} + 1\right)}\right] \quad \text{EQUATION 1}$$

(exemplary values)      EQUATION 2

$V_C = 3(V_{apc} - 0.4)$, $R_f = 10\ K\ \Omega$,
$R_g = 5\ K\ \Omega$, $I_{of\ s1} = 120\ uA$ Thus, it is possible to look at the value of Vapc (at a relatively upstream location in the control system) and calculate or predict what VC should be or will be in the near future. Looking at Vapc (instead of VC) to set limits on the drain-to-source voltage of the main PFET PX greatly improves the response of the control system. This improvement also applies to setting an absolute limit on VC (as discussed below regarding the VCmax Limiter circuit).

As the output voltage VC of the collector regulator approaches the battery voltage, the bandwidth of the regulator will decrease. Eventually, the bandwidth of the regulator will fall to essentially zero if driven hard enough. Thus if VC is directly sensed, then any control loop used to limit VC will include the regulator bandwidth and will become very slow and possibly un-stable. By using Vapc for control (instead of VC), then the control does not see the regulator bandwidth, and thus will respond quickly. The actual output voltage of the regulator VC will lag the setting of Vapc, but will achieve the desired value in a smooth fashion.

A sample of the battery voltage (Vbatt_sample) is formed by voltage division of resistors R2 and R1. This voltage is equal to:

$$V_{Batt\_sample} = \frac{\frac{R_1}{R_2}}{\left(1+\frac{R_1}{R_2}\right)}V_{Batt} + I_{of\ s2}\frac{R_1}{\left(1+\frac{R_1}{R_2}\right)} \quad \text{EQUATION 3}$$

$$V_{Batt\_sample} = \frac{V_{Batt}}{3} + 0.3 \quad \text{EQUATION 4}$$

$$R1 = 5\ K\ \Omega,\ R2 = 10\ K\ \Omega,$$

$$I_{of\ s2} = 90\ uA$$

Under normal circumstances Vbatt_sample is larger than Vapc. Thus P1 and N1 normally conduct no current. If Vapc approaches Vbatt_sample, then P2 begins to turn off and P1 begins to turn on, then current Ierror will pass through N1 and will at least slow Vapc from rising further (preferably stopping Vapc from rising further).

The current Ierror conducted by N1 is drawn from the output of the integration trans-conductance amplifier Agm and/or from charge stored in capacitor C2. Since the integration amplifier Agm is typically limited to a maximum 10 uA of output current Igm, then the current Ierror drawn by N1 is able to overcome (shunt away) the integrator output current Igm, thus stopping Vapc from rising further. Thus, the integrator does not "wind up" when the Saturation Limiter is used.

The corresponding threshold value of VC is found by substituting Vapc=Vbatt_sample into the expression for VC, as shown below.

$$V_{Gth} = \quad \text{EQUATION 5}$$

$$\left(\frac{R_f}{R_g}+1\right)\left[\frac{\frac{R_1}{R_2}}{\left(1+\frac{R_1}{R_2}\right)}V_{Batt}+I_{of\ s2}\frac{R_1}{\left(1+\frac{R_1}{R_2}\right)} - \frac{I_{ofs1}R_f}{\left(\frac{R_f}{R_g}+1\right)}\right]$$

$$V_{Gth} - V_{Batt} - 0.0 \quad \text{EQUATION 6}$$

This threshold can be modified by changing the value of $I_{ofs2}$. Note that all quantities in the above equation are ratios of integrated resistors or a resistor multiplied by a bandgap current which is derived from the same resistor type. Thus, the threshold voltage should be very accurately maintained over all conditions, as long as the battery voltage Vbatt remains constant.

Figure 8:
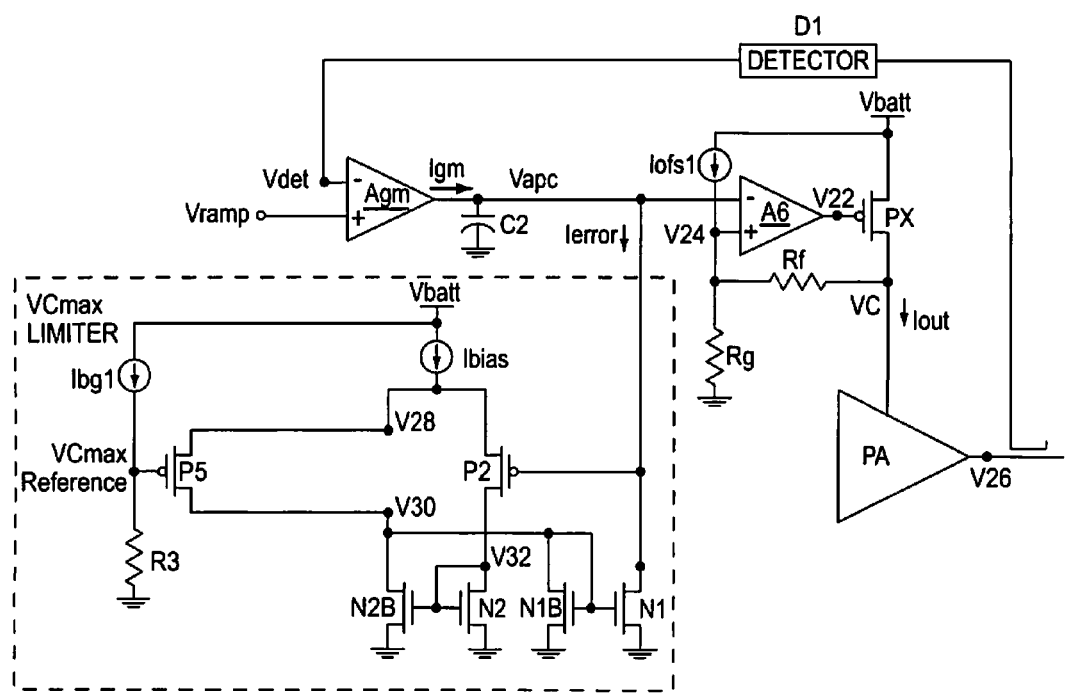
FIG. 8 illustrates VCmax LIMITER, as part of a feedback (closed loop) integrative control system for a power amplifier.

FIG. 8 illustrates VCmax LIMITER, as part of a feedback (closed loop) integrative control system for a power amplifier. VCmax Limiter prevents VC from getting too large relative to an absolute voltage.

In FIG. 8, the VCmax Limiter circuit is shown in a dashed box, and is similar to the Saturation Limiter circuit of FIG. 7 in that Ierror is drawn from the feedback circuit to control Vapc. Additionally, many of the elements of the VCmax Limiter are identical to those of the Saturation Limiter, and operate identically (Ibias, P2, N1, N1B, N2, and N2B).

However, the VCmax Limiter generates an absolute voltage VCmax_reference which remains constant (even if Vbatt fluctuates). This absolute voltage VCmax_reference is very different from the variable voltage Vbatt_sample of FIG. 7.

VCmax_reference is generated by a fixed current source Ibg1 passing through a fixed resistor R3 towards ground, thus generating a fixed voltage VCmax_reference. Similar to the above discussion in FIG. 7, as Vapc approaches VCmax_reference, then current Ierror is drawn through NFET N1.

The breakdown voltage of SiGe devices is not as high as GaAs devices. Thus, SiGe devices are relatively fragile with respect to high supply voltages, and an SiGe RF device can be destroyed under certain load impedance conditions. This voltage limiting circuit (VCmax Limiter) prevents this destruction. This voltage limiting circuit may share portions of the Saturation Limiter circuit, as discussed briefly above, and as shown in a later figure.

The reference voltage VCmax_reference may be formed by a current (Ibg1) derived from a bandgap reference, and by resistor R3. This voltage (VCmax_reference) is compared to Vapc. If Vapc exceeds the threshold reference voltage (VCmax_reference), then a current Ierror is drawn from the output of the trans-conductance amplifier in the same fashion as was done in the Saturation Limiter. This Ierror current stops the rise in Vapc, and stops the rise in VC, thus protecting the RF device.

Therefore, the VCmax Limiter circuit is primarily designed to protect the PA from destruction by overvoltage.

$$V_{Gmax\_ref} = I_{bg1}R3 \quad \text{EQUATION 7}$$

$$V_{Gmax\_th} = \left(\frac{R_f}{R_g}+1\right)\left[I_{bg1}R3 - \frac{I_{ofs1}R_f}{\left(\frac{R_f}{R_g}+1\right)}\right] \quad \text{EQUATION 8}$$

$$V_{Gmax\_th} = 3.7\ I_{bg1} = 20\ uA,\ R3 = 80.65\ K\ \Omega \quad \text{EQUATION 9}$$

This threshold is modified by changing the value of R3. As for the Saturation Limiter, the threshold should be very accurate because all terms of the equation are ratios of integrated resistors or a resistor multiplied by a bandgap current. which is derived from the same resistor type.

Figure 9:
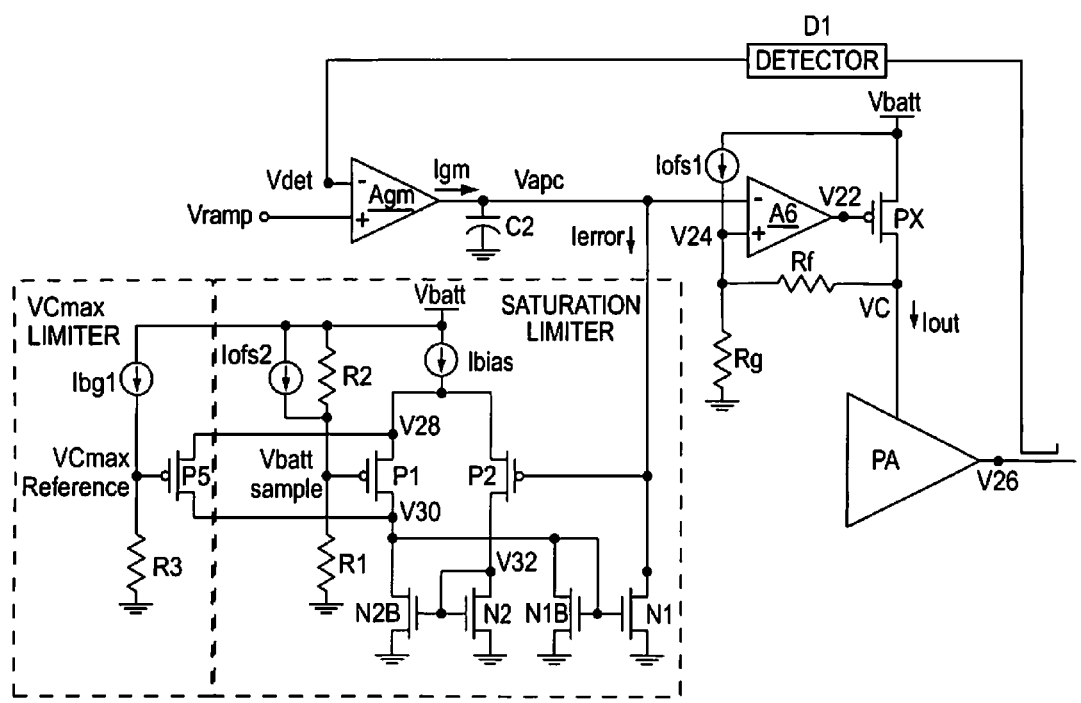
FIG. 9 illustrates a merged SATURATION LIMITER and VCmax LIMITER, as part of a feedback (closed loop) integrative control system for a power amplifier.

FIG. 9 illustrates a merged SATURATION LIMITER and a VCmax LIMITER, as part of a feedback (closed loop) integrative control system for a power amplifier.

In FIG. 9, the Saturation Limiter of FIG. 7 and the VCmax Limiter of FIG. 8 are both presented. The dashed box on the left is labeled VCmax Limiter, and only includes elements which are additional to the Saturation Limiter.

Each of these circuit blocks (Saturation Limiter and VCmax Limiter) operates on a different principal. As shown in FIG. 9, VCmax LIMITER shares some components with SATURATION LIMITER: shares current source Ibias, PFET P2, NFET N2, and NFET N2B). This sharing is not essential, but is efficient.

The lower of VCmax_reference or Vbatt_sample will be reached as Vapc increases, and will force N1 to draw current Ierror. If VCmax_reference is lower, then VCmax Limiter will dominate control, and the Saturation Limiter will remain inactive. If Vbatt_sample is lower, then the Saturation Limiter will dominate control, and the VCmax Limiter will remain inactive.

If VCmax_reference equals Vbatt_sample, then both will attempt to simultaneously control, and both will simultaneously attempt to force N1 to draw current Ierror. This may cause a slightly quicker response to an undesired increase in Vapc.

Figure 10:
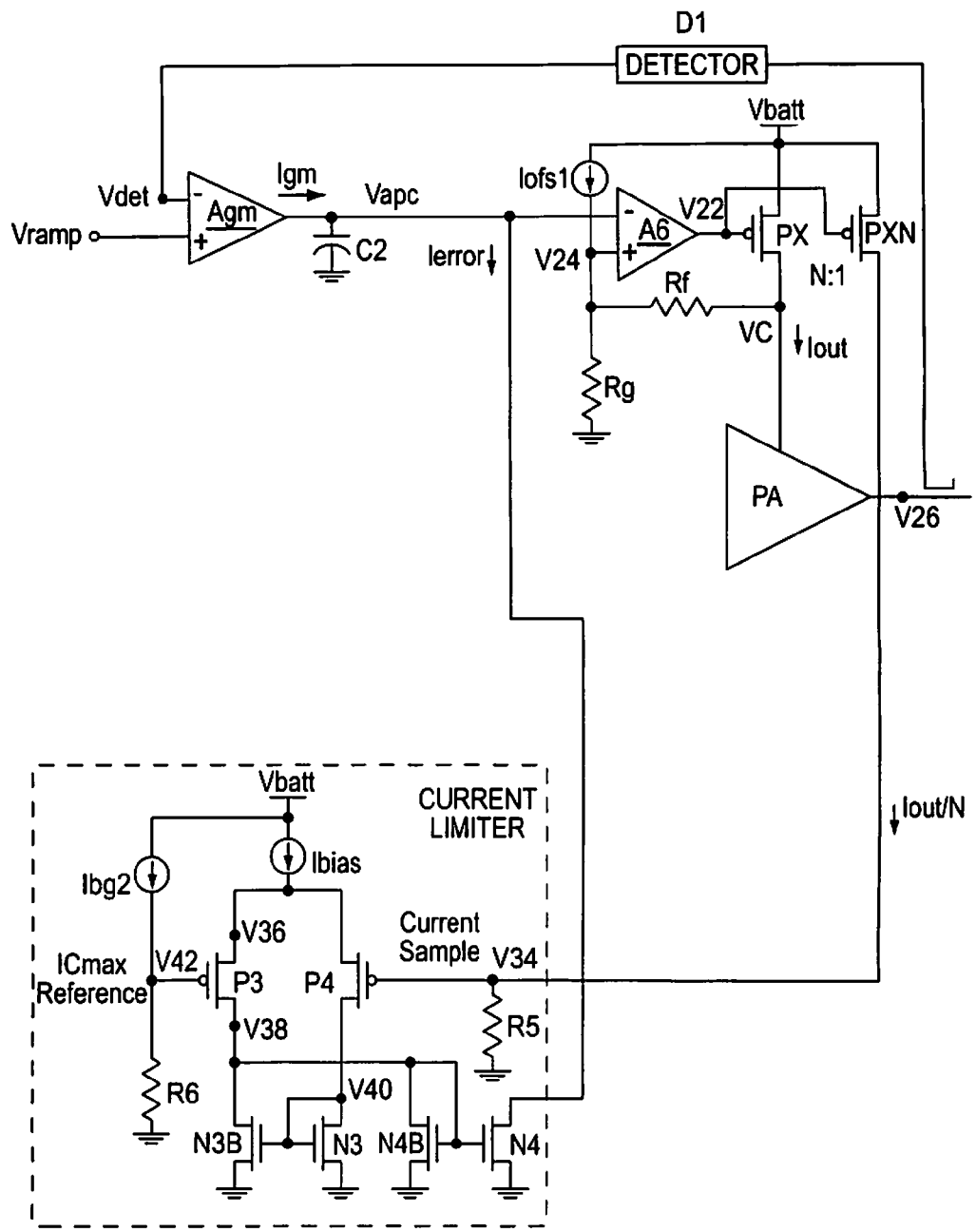
FIG. 10 illustrates a CURRENT LIMITER, as part of a feedback (closed loop) integrative control system for a power amplifier.

FIG. 10 illustrates a CURRENT LIMITER, as part of a feedback (closed loop) integrative control system for a power amplifier. Excessive currents may destroy the power amplifier PA.

In FIG. 10, the feedback integrative control system of FIGS. 6-9 is repeated. A Current Limiter circuit is added, as shown in the dashed box. Sampler PFET PXN is also part of this circuit, although it is shown outside of the dashed box near PFET PX for convenience. PFET PXN is a small PFET, only 1/N the size of main PFET PX. Thus, PXN generates a sample current Iout/N which is only 1/N the size of Iout. Iout is the current from main PFET PX to the power amplifier PA.

The Current Limiter uses Iout/N from PXN to measure Iout. Iout/N is grounded through resistor R5, thus creating a proportional voltage V34. Proportional voltage V34 is compared against a reference voltage ICmax_reference V42.

Reference voltage ICmax_reference V42 is created similarly to VCmax_reference from the VCmax Limiter, by using a current source Ibg2 passing through a resistor R6.

A system employing the present disclosure may output a constant voltage from the PA, regardless of the load impedance. Thus, if the load impedance presented to the PA is low, then the current may be very high and may damage the device or exceed the maximum rated current of the battery.

In some embodiments, the integration loop should greatly reduce these current variations because a higher output current should correspond to a higher output power; thus, the control loop should back off the integrator output (Vapc) to maintain the same forward power provided by the PA to an external load.

However, the forward power may not be well correlated with the DC current exiting the PA (for example, a short circuit external load with zero impedance), and thus an excessive current may still be possible.

The Current Limiter control loop includes the collector regulator (scaling amplifier A6, located before current Iout and before sampling current Iout/N). However, the collector regulator should not be in saturation; thus, the bandwidth of the collector regulator should still be fairly high if the current limit is exceeded. Therefore, the Current Limiter loop may not be significantly slower than the other limiters previously discussed (Saturation Limiter and VCmax Limiter).

Figure 11:
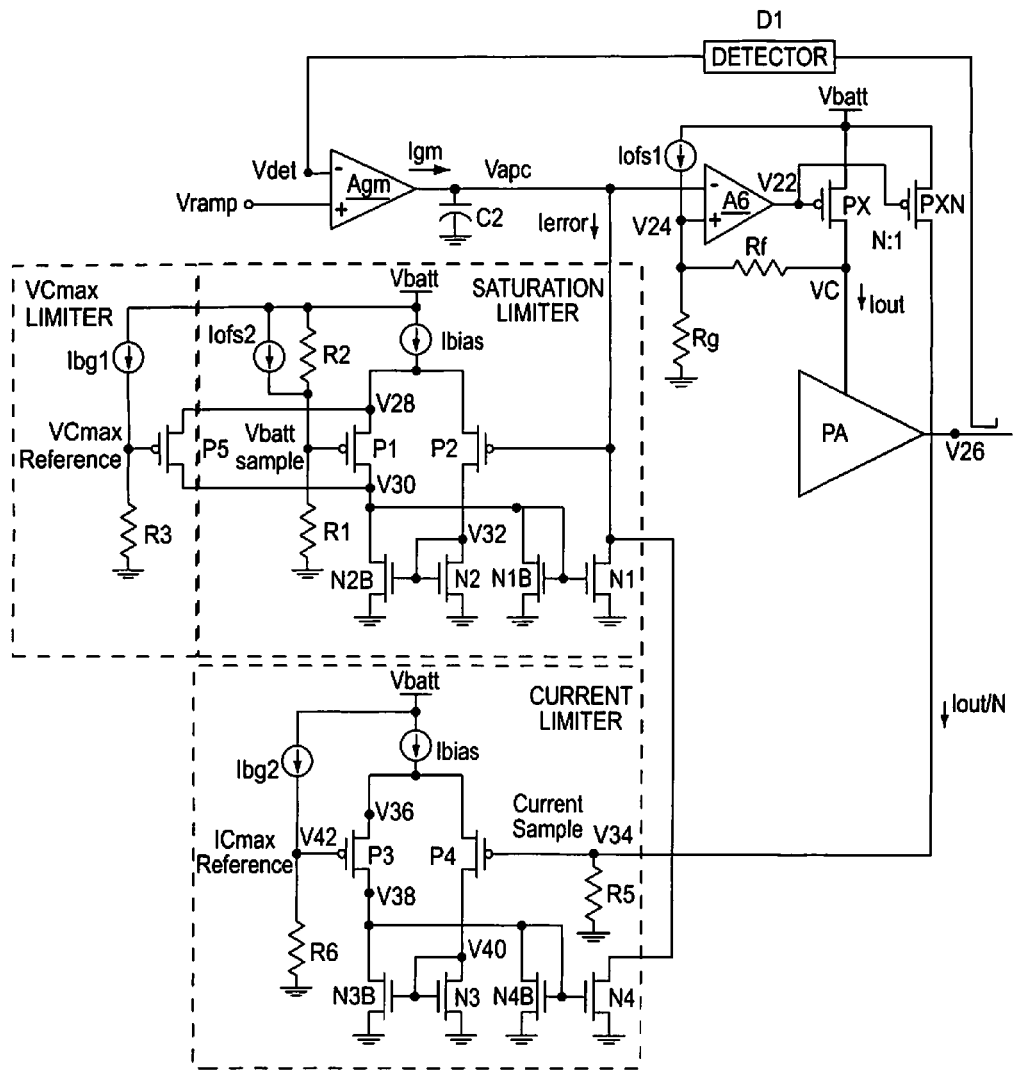
FIG. 11 illustrates a SATURATION LIMITER, a VCmax LIMITER, and a CURRENT LIMITER, as part of a feedback (closed loop) integrative control system for a power amplifier.

FIG. 11 illustrates a SATURATION LIMITER, a VCmax LIMITER, and a CURRENT LIMITER, as part of a feedback (closed loop) integrative control system for a power amplifier.

In FIG. 11, the Current Limiter of FIG. 10 is added to the merged Saturation Limiter and VCmax Limiter of FIG. 9. All of these limiters have previously been discussed in detail. All three limiters draw current through Ierror under certain circumstances. It is possible that two or more of these limiters may simultaneously attempt to draw Ierror, and in this case Ierror would be large.

Figure 12:
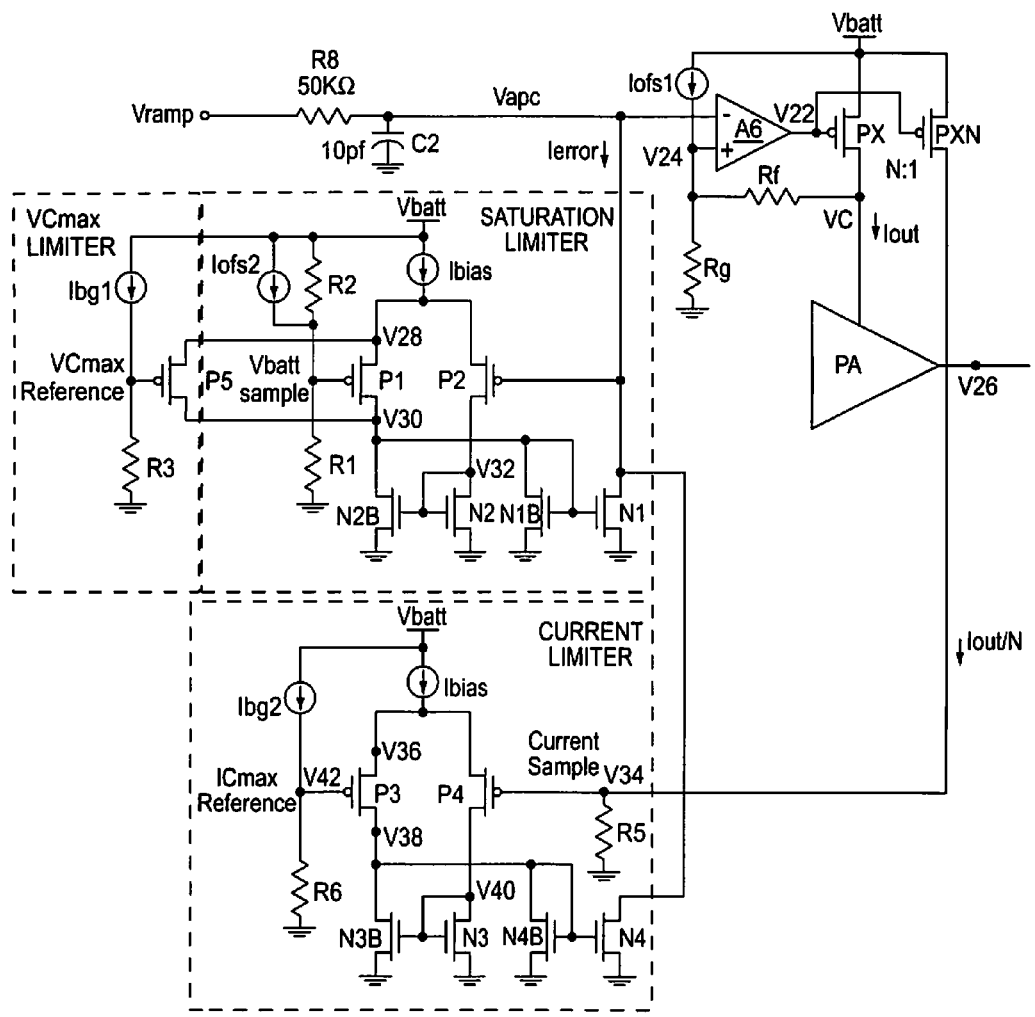
FIG. 12 illustrates a non-feedback control system, including a SATURATION LIMITER, a VCmax LIMITER, and a CURRENT LIMITER.

FIG. 12 illustrates a non-feedback control system, including a SATURATION LIMITER, a VCmax LIMITER, and a CURRENT LIMITER. These limiter systems operate almost exactly as described above in the context of a feedback control system.

In FIG. 12, there is no feedback loop from the voltage output V26 of the power amplifier PA. Thus, there is no trans-conductance amplifier (Agm in previous figures) with a limited current output (Igm in previous figures) driving Vapc. However, any realistic system should have an RC input filter (R8 and C2) to reduce noise from the transceiver D/A converter (not shown) used to drive Vramp.

This RC filter should provide the same limited output current capability as the trans-conductance amplifier, and should allow the system to function almost exactly the same as shown previously. For example, if the input resistance R8 is 50 KΩ, and if Ierror is 4 uA, then Vapc will shift downward by 200 mV. Thus, Ierror is easily able to pull Vapc down, as in the closed loop case.

Those skilled in the art will recognize improvements and modifications to the preferred embodiments of the present disclosure. All such improvements and modifications are considered within the scope of the concepts disclosed herein and the claims that follow.

What is claimed is:

1. A circuit for controlling a power amplifier, the circuit comprising:
 a control portion; and
 a saturation limiter portion configured to:
  generate a scaled battery voltage that is a first function of the battery voltage;
  compare a first control voltage from a first control node of the control portion against the scaled battery voltage; and
  draw an error current away from the first control node based on the comparison of the first control voltage against the scaled battery voltage.

2. The circuit of claim 1, wherein the scaled battery voltage is a predetermined fraction of the battery voltage, and the scaled battery voltage changes proportionally as the battery voltage changes.

3. The circuit of claim 2, wherein the error current is positive when the first control voltage exceeds the scaled battery voltage.

4. The circuit of claim 2, wherein the error current is zero when the scaled battery voltage exceeds the first control voltage.

5. The circuit of claim 1, wherein the control portion comprises:
 a trans-conductive amplifier configured to receive a detected voltage, receive a ramp voltage, and output a trans-conductive current; and
 the first control node, such that the first control node is configured to receive the trans-conductive current and to receive the error current.

6. The circuit of claim 5, wherein the control portion further comprises:
 a scaling amplifier configured to receive the first control voltage and to generate a second control voltage.

7. The circuit of claim 6, wherein the control portion further comprises:
 a main transistor configured to receive the second control voltage and to send a third control voltage to the power amplifier.

8. The circuit of claim 7, wherein the control portion further comprises:
 a detector configured to detect an output voltage from the power amplifier, and configured to send the detector voltage to the trans-conductive amplifier.

9. The circuit of claim 1, wherein the control portion comprises:
 a resistor configured to receive a ramp voltage and to output the first control voltage to the first control node;
 a capacitor linking the first control node to ground;
 a first scaling amplifier configured to receive the first control voltage from the first control node, and configured to output a second control voltage;
 a main transistor configured to receive the second control voltage, and configured to output a third control voltage to the power amplifier.

10. The circuit of claim 1, wherein the circuit further comprises:
 a voltage limiter portion.

11. The circuit of claim 10, wherein the voltage limiter portion is configured to:

draw the error current away from the first control node as a function of a comparison between the first control voltage and a first predetermined maximum voltage.

12. The circuit of claim 11, wherein the error current is positive when the first control voltage exceeds the first predetermined maximum voltage.

13. The circuit of claim 1, further comprising:
a current limiter portion.

14. The circuit of claim 13, wherein the current limiter portion is configured to:
draw the error current Ierror from the first control node when a current from a main transistor to the power amplifier exceeds a predetermined maximum current.

15. A method for controlling a power amplifier, the method comprising:
creating a scaled battery voltage that is a first function of the battery voltage;
comparing a first control voltage from a first control node against the scaled battery voltage; and
drawing an error current away from the first control node based on the comparison of the first control voltage and the scaled battery voltage.

16. The method of claim 15, further comprising:
using the first control voltage to control the power amplifier.

17. The method of claim 15, further comprising:
scaling the first control voltage to generate a second control voltage.

18. The method of claim 17, further comprising:
using the second control voltage to control a main transistor, wherein the main transistor generates a third control voltage; and
using the third control voltage to control the power amplifier; and
outputting a power amplifier output voltage from the power amplifier.

19. The method of claim 18, further comprising:
detecting the power amplifier output voltage; and
generating a feedback detection voltage.

20. The method of claim 19, further comprising:
generating a first control current based on a comparison of the feedback detection voltage and a first input control voltage.

21. The method of claim 20, wherein the first control current feeds into the first control node, and wherein a first capacitor links the first control node to a ground.

22. The method of claim 15, wherein the scaled battery voltage is a predetermined fraction of the battery voltage, and the scaled battery voltage changes proportionally as the battery voltage changes.

23. The method of claim 15, wherein the error current is positive when the first control voltage exceeds the scaled battery voltage.

24. The method of claim 15, wherein the error current is zero when the scaled battery voltage exceeds the first control voltage.

25. The method of claim 15, further comprising:
drawing the error current away from the first control node as a function of a comparison between the first control voltage and a first predetermined maximum voltage.

26. The method of claim 25, wherein the error current is positive when the first control voltage exceeds the first predetermined maximum voltage.

27. The method of claim 15, further comprising:
drawing the error current from the first control node when a current from a main transistor to the power amplifier exceeds a predetermined maximum current.

28. The method of claim 15, further comprising:
generating a sample current based on a current from a main transistor to the power amplifier;
generating a sample voltage based on the sample current;
generating a predetermined maximum voltage associated with a predetermined maximum current;
drawing the error current from the first control node when the sample voltage exceeds the predetermined maximum voltage associated with the predetermined maximum current.

* * * * *

UNITED STATES PATENT AND TRADEMARK OFFICE
CERTIFICATE OF CORRECTION

PATENT NO. : 8,907,726 B2  Page 1 of 1
APPLICATION NO. : 13/668641
DATED : December 9, 2014
INVENTOR(S) : Jeffery P. Ortiz et al.

It is certified that error appears in the above-identified patent and that said Letters Patent is hereby corrected as shown below:

In the Specification

In column 4, line 18, replace "Iout" with --Iout--.

In column 4, line 41, replace "Rr1" with --Rrl--.

In column 7, line 42, replace "0.0" with --0.3--.

Signed and Sealed this
Thirtieth Day of June, 2015

Michelle K. Lee
*Director of the United States Patent and Trademark Office*